INVENTOR.
KERN K.N. CHANG
BY
Edward J Norton
Attorney

INVENTOR.
KERN K. N. CHANG
BY
Edward J. Norton
Attorney

INVENTOR.
KERN K. N. CHANG
BY
Edward J. Norton
Attorney

INVENTOR.
KERN K.N. CHANG
BY
Edward J Norton
Attorney

United States Patent Office 3,513,403
Patented May 19, 1970

3,513,403

INTEGRATED SEMICONDUCTOR STRUCTURE WITH FREQUENCY SELECTIVE TRANSMISSION LINE SECTIONS

Kern K. N. Chang, Princeton, N.J., assignor to RCA Corporation, a corporation of Delaware Filed June 28, 1966, Ser. No. 561,195
Int. Cl. H03f 7/00; H03k 3/26
U.S. Cl. 330—4.9 10 Claims

ABSTRACT OF THE DISCLOSURE

A plurality of different characteristic P-N devices are formed on a semiconductor wafer. The P-N devices are coupled to metal, conducting vanes dimensioned to support a desired band of frequencies and can be fabricated as thin film strips. The P-N devices are separately biased and because of their different impurity densities assume the characteristics of tunnel diodes, avalanche diodes or varactor diodes. A signal to be processed is applied to one of the P-N junctions where it is amplified, frequency multiplied or frequency divided. The vanes are so spaced on the wafer that they capacitively couple the transformed energy from one P-N device to another different characteristic P-N device to allow further processing of the signal. By the proper location of the P-N devices and the proper spacing, location and dimensioning of the metal vanes or thin film strips, a number of different devices and different operations can be achieved. The composite structure so provided lends itself to integrated thin film circuit techniques, such as hybrid or monolithic integrated configurations while providing extremely high frequency operation.

This invention relates to semiconductor devices and more particularly to solid state, semiconductor microwave devices.

A limited variety of solid state components are now available for use in microwave devices. In the frequency range between 400 MHz. and 4,000 MHz., tunnel diodes, varactors and transistors are competing with one another in various applications according to their individual characteristics. At higher microwave frequencies above 4,000 MHz., transistors are difficult to fabricate and operate Varactors face complications in the provision of a separate high frequency pump when used as parametric elements for amplification. Numerous types of microwave devices using varactors, transistors, or tunnel diodes have been proposed including frequency multipliers, dividers, oscillators, amplifiers, mixers, and so on. Such devices have for the most part required the use of circulators, isolators and related components which greatly add to the expense and complexity. None of the presently available devices separately possesses a performance capability affording a combination of low noise, large dynamic range, broad band width and high amplification factors with stability and simplicity of operation and construction.

It is therefore an object of the present invention to provide an improved microwave solid state device.

Another object is to provide an improved semiconductor microwave device capable of a large dynamic range with stability of operation.

Still another object is to provide an improved microwave amplifier capable of broad bandwidth operation and low noise performance.

A further object is to provide an improved solid state microwave device capable of operating with extreme stability at high amplification factors.

Still a further object is to provide an improved microwave amplifier eliminating the need for isolators, circulators and related components.

According to one embodiment of the present invention, a wafer of semiconductor material having a specific conductivity, which may be N or P type material, is defined by a plurality of regions, each of the regions having a different impurity density. A zone of P or N type material is deposited on or diffused in the wafer above or adjacent to each region. The added zone of P or N type material has a impurity density compatible with the corresponding region on the semiconductor wafer. A plurality of different characteristic P-N devices are in this manner formed on the wafer. The P-N devices are coupled to metal, conducting vanes. The vanes are dimensioned to support a predetermined or desired band of frequencies and can be fabricated as thin film strips. The P-N devices are separately biased and because of their different impurity densities assume the characteristics of tunnel diodes, avalanche diodes or varactor diodes. A signal to be processed is applied to an input pair of vanes forming a transmission line and coupled to the associated P-N junction where it is amplified, multiplied or divided. The vanes are so spaced on the wafer that they capacitively couple the transformed energy from one P-N device to another different characteristic P-N device to allow further processing of the signal. By the proper location of the P-N devices and the proper spacing, location and dimentioning of the metal vanes or thin film strips, a number of different devices and different operations can be achieved. This technique allows simple fabrication, easy cascading of devices and high frequency gain and bandwidth operation. The composite structure so provided lends itself to integrated thin film circuit techniques, such as hydrid or monolithic integrated configurations while providing extremely high frequency operation.

The novel features of this invention, as well as other objects, uses, and advantages thereof will now be explained in the following specification together with the accompanying drawing in which:

FIG. 1*a* is a top plane pictorial view of an amplifier according to this invention.

FIG. 1*b* is a front plane sectional view of the amplifier of FIG. 1*a* taken at the intersection line 1*b*—1*b*.

FIG. 1*c* is a side plane sectional view of the amplifier of FIG. 1*a* taken at the intersection line 1*c*—1*c*.

FIG. 2*a* is a front plane sectional view of another configuration which configuration can be used in lieu of FIG. 1*b*.

FIG. 2*b* is a side plane sectional view according to FIG. 2*a* which can be used in lieu of FIG. 1*c*.

FIG. 3*a* is a front plane sectional view of still another configuration which can also be used in lieu of FIG. 1*b*.

FIG. 3*b* is a side plane sectional view of still another configuration which can also be used in lieu of FIG. 1*c*.

Figure 1A:
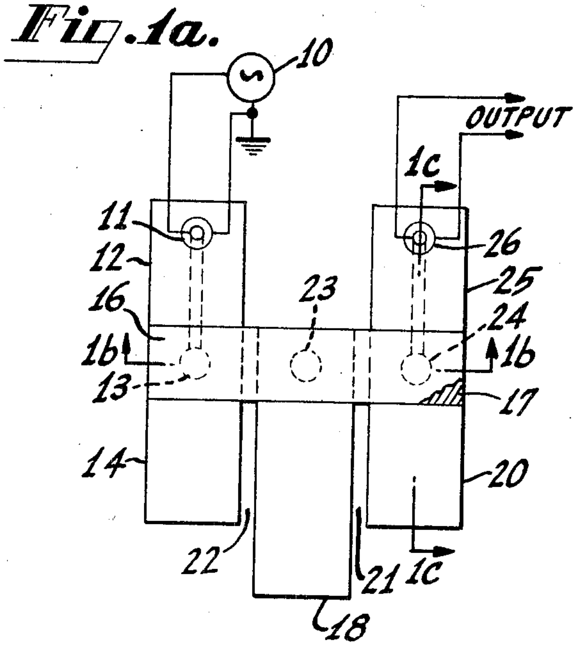

If reference is made to FIG. 1*a*, there is shown a top plane pictorial view of an amplifying device according to this invention. Numeral 10 refers to a source of input signals which may be an oscillator, receiver, antenna or some other device capable of responding to or generating a signal at a frequency or band of frequencies to be amplified. The signal source 10 is coupled by a suitable transmission line to a coaxial type connector 11 which is mounted on a metal input vane 12. The metal vane 12, which forms one conductor of at least a two conductor transmission line, is dimensioned to accommodate the frequency or band of frequencies of the signal emanating from the signal source 10. Hence, the dimensions of the vane 12 both as to length and width are chosen to be a multiple of or a fraction of a wavelength of the desired input frequency or the center frequency of the input band of frequencies. The metal vane 12 is fabricated from a good conducting material such as copper, aluminum, or silver and can be deposited on a supporting base in the proper location as part of thin film or strip transmission line.

A semiconductor wafer 17 is positioned beneath a metal layer 16 fabricated from material as used for the vane 12 and separated by an insulating material, described later, from layer 16. The layer 16 and the insulator is broken away in FIG. 1*a* to expose the position of the wafer 17. The layer 16 is in electrical contact with the vane 12. A P-N device 13 formed on the wafer 17 is shown by dotted lines as positioned between the semiconductor layer 17 and the layer 16. The size of the wafer 17 has to be long enough to accommodate the metal vanes 14, 18 and 20 to be described and the spacings 21 and 22 therebetween. The metal layer 16 serves to prevent radiation losses from the device. The P-N device 13, which will be described more fully along with the construction of the wafer 17 in connection with FIGS. 1*b* and 1*c*, can be doped or made to have an impurity density enabling it to operate as a varactor diode and with proper biasing can be caused to operate in a non-linear region of its voltage capacitance characteristics. Also shown associated with the diode 13 is another metal vane 14, which is dimensioned to support a different frequency than that supported by the input vane 12. Like vane 12, vane 14 is in electrical contact with the metal layer 16 and forms one conductor of at least a two conductor transmission line.

Numeral 23 represents an avalanche diode formed on the wafer 17 and biased in the reverse direction. Such diodes are P-N junctions, properly doped. It has been shown that avalanche P-N devices, such as diode 23, under the influence of a relatively high reverse bias will exhibit oscillations in the microwave region. The diode 23 is associated with a metal vane 18. The vane 18 is in electrical contact with the layer 16 and forms one conductor of at least a two conductor transmission line. Vane 18 can be constructed of the same material as vanes 12, 14. A predetermined spacing 22 is provided between the metal vanes 14 and 18. The spacing 22 is chosen to afford a capacitance between the vanes 14 and 18 whose reactance at the frequency of the avalanche diode's 23 oscillation is sufficient to transfer energy which is generated in the avalanche diode 23 to the varactor diode 13. Parallel to the metal vane 18, there is shown another metal vane 20, which is separated from vane 18 by a spacing 21. Again, vane 20 is in electrical contact with the layer 16 and forms one conductor of at least a two conductor transmission line. Vane 20 can be constructed in the manner of vanes 18, 14 and 12. The spacing 21 is chosen so that it introduces a capacitance between the vanes 18 and 20, whose reactance is sufficient to pass energy, substantially unattenuated, at the frequencies of interest. The vane 20 is associated with a third diode or P-N device 24 formed on the wafer 17, whose impurity density is that of a tunnel diode. The tunnel diode 24 is also associated with an output vane 25, on which is mounted an output coaxial type connector 26, which enables one to couple power out of the device described. Vane 25 is in electrical contact with the layer 16 and forms one conductor of at least a two conductor transmission line. Vane 25 can be constructed in the manner of vanes 12, 14, 18 and 20.

Figure 1C:
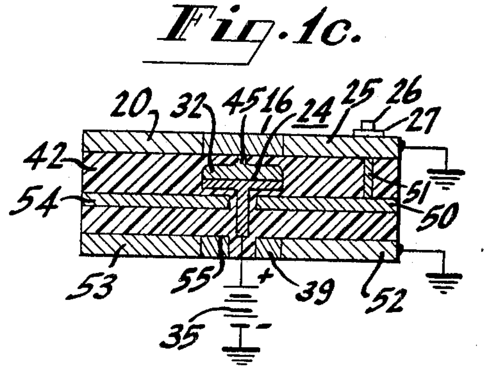
Figure 1B:
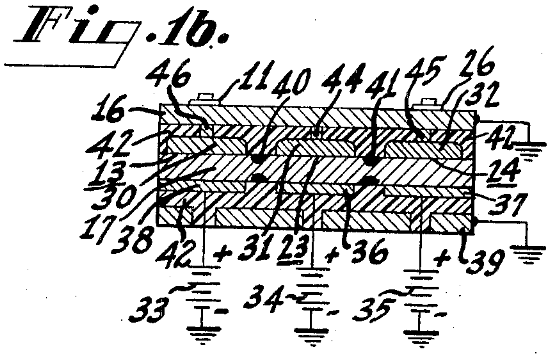

If reference is now made to FIG. 1*b*, there is shown a cross sectional view of one example of the construction of the device shown in FIG. 1*a* taken through the section line shown in FIG. 1*a* as 1*b*—1*b*. Numeral 16 refers to the metal plate or layer shown in FIG. 1*a*. This plate is shown as grounded. Vanes 12, 14, 18, 20 and 25 in contact with the layer 16 are likewise at ground or reference potential. Numeral 17 references a layer of semiconductor material which could be of N or P type conductivity and fabricated from silicon, gallium arsenide, germanium or other suitable material suitably doped. For convenience it is assumed that the semiconductor wafer or layer 17 is N type material. In this case the N type layer 17 is suitably processed in at least three regions. As will be shown below, the number of regions would obviously be greater or less for different applications. The three regions are shown separated by the darkened isolation zones 40 and 41, whose function will also be described later. Hence the region to the left of isolation zone 40 may be of one level of impurity density, the region between isolation zones 40 and 41 another and that to the right of isolation zone 41, still another region of different impurity density. For example, in order to achieve the different impurity regions, a wafer of intrinsic silicon might be treated and doped by suitable techniques, as diffusing, which are known in the state of the art and not considered as part of this invention. In any case a different impurity level is diffused into the wafer 17 in each of the three regions, compatible with the device to be formed. Hence the region to the left of zone 40 would have a suitable impurity such as phosphorous, arsenic, antimony or those appearing in Group V of the Periodic Table diffused into the semiconductor wafer 17 to have a relatively high impurity density which would be on the order of $10^{16}$ to $10^{20}$ atoms per cubic centimeter. This can be compared to a conventional P-N junction which has about $10^{15}$ atoms per cubic centimeter or about one impurity atom for every $10^{8}$ parent crystal atoms. Above this region there is shown a zone 30. Zone 30 is a P type zone obtained by diffusing P type impurities to a fixed depth on the region to the left of isolation zone 40. Such impurities might be boron, aluminum, gallium, indium, and so on, namely those appearing in Group III of the Periodic Table. The diffusion of the P type region is controlled so that the impurity density is of the same order of magnitude as that of the N type material below, namely, $10^{16}$–$10^{20}$ atoms per cubic centimeter. A junction corresponding to the diode 13 represented in FIG. 1*a* is formed at the interface of the N region to the left of isolation zone 40 and the P zone 30. Techniques for forming junctions are well known in the art, see for instance Section 7 of L. P. Hunter, Handbook of Semiconductor Electronics, McGraw-Hill (1962), Second Edition, and are not considered as part of this invention. The junction thus formed will perform as the varactor or variable reactance diode 13 of FIG. 1*a* if a proper reverse bias is applied. A varactor exhibits non-linear capacity and low series resistance which characteristics result from a high impurity concentration outside the depletion layer region and a relatively low concentration at the junction.

A layer 38 serves as a means to attach a lead to the N region of the varactor 13. The layer 38 may be fabricated from aluminum, gold, indium, nickel or other suitable material properly doped and dimensioned. The width of layer 38 is chosen to offer an inductance which serves to isolate the separate bias sources as will be explained further on. The P region 30 is connected by a lead 46 to the grounded plate 16. The lead 46 may be fabricated of the same material as the layer 38. A biasing source 33 shown as a direct current battery is connected between the lead layer 38 and ground. In this case because wafer 17 is assumed to be N type semiconductor material and zone 30 P type, the varactor 13 is reversed biased by the D.C. supply 33 and assumes a quiescent value of capacity. The capacitance can be made to vary about this value by the application of a suitable pump signal. After the diffusion process has been completed, as described above, the outer boundaries can be etched and filled in with an insulator or dielectric to isolate the varactor 13. Hence regions as 40 are formed by filling in the etched out area with aluminum oxide or some other suitable insulating material.

The region of the semiconductor wafer 17 between the isolation zones 40 and 41 is treated to have an impurity density on the order of $10^{15}$–$10^{20}$ atoms per cubic centimeter by an N type dopant which may be an element from Group V of the Periodic Table. Above this region a P type material is diffused to form a junction at the interface with the N region. The P zone 31 of material is brought into contact with the grounded layer 16 via lead 44 which is of the same material as described previously for lead 46. There is also a contact and inductor layer 36 which serves the same purpose as layer 38, namely, to isolate the D.C. supplies. A source of D.C. potential 34 is used to bias the resulting junction corresponding to the diode 23 represented in FIG. 1*a* in a reverse direction, causing the junction to be brought into the avalanche mode of operation. It has been shown in the prior art that biasing in the avalanche mode will cause a diode to oscillate at microwave frequencies if there is a resonant circuit to support oscillations. Such a resonant circuit is provided by the arrangement of FIGS. 1*a* and 1*b* and will be described later on. The P-N device 23 is isolated by means of zones 41 which are etched and filled in as heretofore described in the case of zone 40.

A tunnel junction 24 is formed to the right of the avalanche junction 23 by diffusing impurity carriers into the semiconductor wafer 17 at a concentration of $10^{17}$–$10^{20}$ atoms per cubic centimeter. The P region 32 is deposited above the treated N region of semiconductor wafer 17 and has a compatible carrier concentration. A lead 45 is fabricated, as described before, and connects the P region 32 with the grounded metal plate or layer 16. A contact and an inductor wafer 37 is attached to the tunnel region to provide means for connecting a bias supply 35 to the junction 24. A grounded metal layer or plate 39 which is similar to the grounded plate 16 with the exception that there are holes or openings in plate 39 through which the bias leads which go to the batteries 33, 34 and 35 are brought. The area between the plates 16 and 39 and about the junctions 13, 23, 24 is filled with a suitable dielectric material 42, such as aluminum oxide, fiber glass or rutile.

Figure 2A:
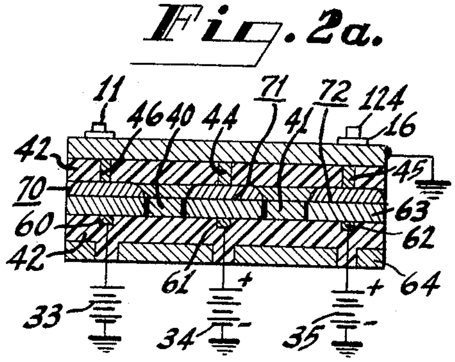
Figures 2B, 3A, 3B:
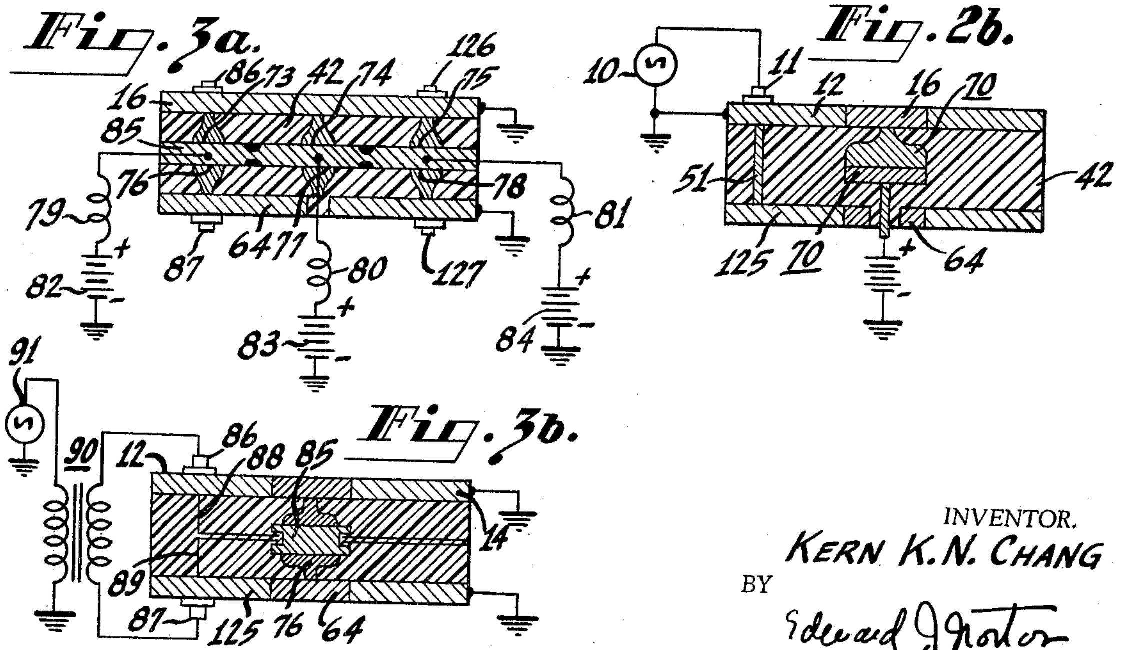

FIG. 1*c* shows a side sectional view taken at line 1c—1c of FIG. 1*a*. There is shown a coaxial connector 26 which represents the output connector. The shield portion 27 of the connector 26 is grounded on the output vane 25 which connects to the grounded plate 16 and is therefore also at ground potential. In actual practice the vanes shown on FIG. 1*a* as 12, 14, 18, 20 and 25 can be made of the same material and be extrusions of grounded plate 16. Hence all the above vanes 12, 14, 18, 20, 25 together with layer 16 can be fabricated from one piece of material or deposited to be contiguous. The center conductor of the connector 26 is brought down and coupled to a center plate 50 via a lead 51. The center plate 50 carries energy from the diode device 24 shown at the center to the output connector 26. The construction by which the input coaxial connector 11 couples energy to the varactor diode 13 follows that shown in FIG. 1*c* for the output connector 26. Also shown in FIG. 1*c* is a bottom metal vane 52 in contact with the bottom ground plate 39 and parallel to the vane 25. Vane 52 is dimensioned exactly as the top vane 25 and forms with the vane 25 a two conductor transmission line. The vane 25, the center conductor 50 and the bottom vane 52 form a transmission line which when dimensioned properly will support a desired band of frequencies. The spacings between the vanes 25, 52, conductor 50 and the junction 24 are indicated as filled with a dielectric 42 as previously described. A further bottom vane 53 is shown which has the same dimensons as and is parallel to the top vane 20 discussed in connection with FIG. 1*a*. A center conductor 54 is also shown. The vanes 20, 53 and conductor 54 form a section of transmission line dimensioned to support a desired band of frequencies as will be described. It is to be understood that the bottom view of the device depicted in FIG. 1*a* will appear substantially similar to the top view shown in FIG. 1*a*. Thus two bottom vanes (not shown) are provided parallel to the vanes 14 and 18. The two vanes so provided are spaced from one another and from the vane 53 at distances equal to the spacings 21 and 22 indicated in FIG. 1*a*. Center conductors can be provided in the manner of the center conductor 54 shown in FIG. 1*c*. Likewise, a vane (not shown) is provided parallel to the input vane 12 and similar in fabrication to the vane 12 except for the connector 11 found only on the vane 12. Thus, the vanes 12, 14, 18, 20 and 25 shown in FIG. 1*a* are each part of a section of transmission line dimensioned to support a frequency or band of frequencies as will be described. FIGS. 2*a* and 2*b* are side and end views respectively of a biplate configuration that could be used in the construction of the device shown in FIG. 1*a* in place of that described in connection with FIGS. 1*b* and 1*c*. A semiconductor wafer 63 is treated in the three regions by masking or other techniques so that three P-N junction devices 70, 71 and 72 are formed on the wafer 63. The three devices have impurity concentrations providing the doping levels necessary to fabricate a varactor junction 70, an avalanche junction 71 and a tunnel junction 72. The P zones of the devices are caused to contact the ground plate 16 via respective leads 46, 44 and 45 which are fabricated in the same manner as mentioned before. The N regions of the wafer 63 are brought out to layers 60, 61 and 62 which can be either ohmic or semiconductor contacts as described previously and so dimensioned to form inductances, which serve to isolate the respective D.C. sources 33, 34 and 35. A bottom plate 64 is provided which corresponds to the bottom plate 39 shown in FIG. 1*a*. As shown in FIG. 2*b*, the plate or layer 64 is not grounded as was the case for the layer 39 but rather is part of the input signal path including vane 125, lead 51, connector 11 and signal source 10. The layer 16, which may be a thin film, and the layer 64, which also may be of thin film construction, form a coaxial type transmission line which serves to couple signal energy from and to the respective junctions 70, 71 and 72. An output coaxial connector 124 of a construction similar to that of the coaxial connector 11 is provided for coupling energy from the last P-N junction 72. It is to be noted that the entire structure including the wafer 63 and transmission line sections forming the device depicted in FIGS. 2*a* and 2*b* could be made in practice by thin film techniques using mask and photo etching techniques. Masks made according to the dimensions of the device can be used as a template to form the junctions and other structure following known processes and techniques.

FIGS. 3*a* and 3*b* illustrate a further construction which may be used for the device of FIG. 1*a*. There is shown a center wafer of N-type semiconductor material 85 such as N-type gallium arsenide. On the top and bottom surfaces, P type material is diffused in a manner to form a P-N device on top of the wafer 85 and another on the bottom. Therefore, there are two P zones associated with each of the three different impurity concentration regions on the N material wafer 85. Each P zone has the same impurity concentration as the N-zone above or beneath it. Thus, three P-N junctions 73, 74, 75 are formed on one side of the wafer 85, and three P-N junctions 76, 77 and 78 are formed on the other side of the wafer 85. The diodes 73, 76 can be constructed to perform the function of the diode 13 of FIG. 1*b*, the second pair of diodes 74, 77 can be constructed to perform the function of the diode 23 of FIG. 1*b*, and the third pair of diodes 75, 78 can be constructed to perform the function of the diode 24 of FIG. 1*b*. The center portion of each of the three regions is brought out to a separate contact to allow connection of each double P-N to a source of biasing potential shown as batteries 82, 83, 84. There is also shown an inductor 79, 80 and 81 in series with each respective D.C. supply to provide isolation between the respective supplies. The inductors 79, 80, 81 can of course be fabricated from metal or semiconductor material or even be calculated and incorporated in the lead length, but are shown as physical elements here to suggest an alternate approach. The device shown in FIG. 3*a* which in all other particulars would be constructed as that shown in FIGS. 1*a*, 1*b* and 1*c*, is a balanced device and provides more efficient and higher frequency operation than the single ended devices described previously.

FIG. 3*b* is an end view of the input side of the device of FIG. 3*a*. The wafer 85 is shown as etched in the area of the first pair of P-N junctions 73, 76 to form a channel on each side. Instead of driving the P-N junctions by a single conductor, there is shown two input coaxial connectors 86, 87 mounted on the top vane 12 and bottom vane 125, respectively. The shields or outer conductors of the connectors 86, 87 are connected to the top and bottom vanes 12 and 125, respectively, which are grounded. The center conductors 88 and 89, which may also be metallic plates, are connected in the channel to allow the coupling signal energy to the two P-N junctions 73, 76. It is also shown by reference to the transformer 90 and source 91 that the desired manner of energizing the balanced device would be in push pull. A pair of output coaxial connectors 126, 127 are indicated in FIG. 3*a* and provide signal connection to the last pair of P-N junctions 75, 78 with a construction similar to that of the connectors 86, 87.

Figure 4:
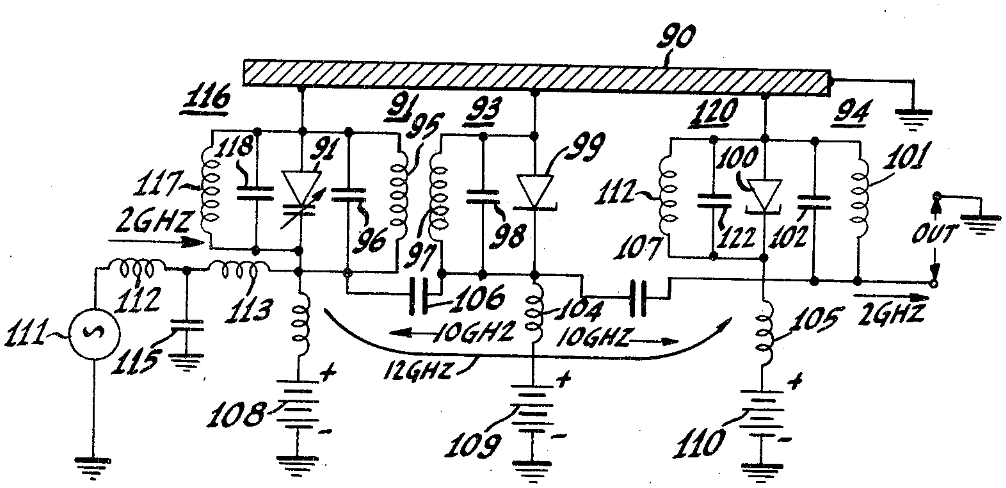
FIG. 4 is a schematic representation of an equivalent circuit of the device depicted in FIGS. 1*a*, 1*b*, 1*c*, 2*a* and 2*b* for a clearer understanding of the operation of the disclosed devices.

The operation of the devices illustrated in FIGS. 1 and 2 will now be described with the assistance of FIG. 4 which presents the equivalent circuit using lumped components. FIG. 4 references a supply of signals 111, which may be an antenna, oscillator, receiver or any device capable of receiving or generating signals to be further amplified. The supply 111 serves the same function as the supply 10 in FIG. 1*a*. For ease of explanation let us assume that the supply 111 furnishes a signal at 2 gHz. ($2\times10^9$ c.p.s.). The supply 111 is shown coupled to a varactor diode 91, the anode of which is connected to a ground plate 90. The varactor 91 is one of the P-N devices fabricated on the semiconductor wafer shown in FIGS. 1 and 2, for example, P–N junction 13 in FIG. 1*b*. The inductance 112 and 113 is that inductance presented by the center conductor of the coaxial connector 11 of FIG. 1*a* and can actually be represented by a plurality of inductors as 112 and 113. There is also shown a capacitor 115, which represents the distributed capacitance from the center conductor of the input coaxial line to a ground plate, as vane 12 in FIG. 1*a*. Hence the inductors 112 and 113 in conjunction with the distributed capacitance 113 form a low pass filter to allow coupling in of the 2 gHz. signal from supply 111, while preventing a higher frequency from coupling back. The varactor diode 91 is biased in the reverse direction by the D.C. source 108 through an inductor 103 to provide isolation. There is also shown a tuned circuit 92 across the varactor 91 comprising an inductor 95 in shunt with a capacitor 96. The tuned circuit 92 represents the equivalent of the transmission line section formed by the metal vanes described in FIGS. 1 and 2 which are properly dimensioned to provide the required resonant circuits at the frequencies of interest. As indicated in the discussion of FIGS. 1 and 2, the next P-N junction is that of an avalanche junction shown as avalanche diode 99, which is also reversed biased, by means of a D.C. source 109 and an isolating inductor 104. As was mentioned previously, avalanche junctions can be made to oscillate at microwave frequencies by the application of a high breakdown reverse bias. The frequencies of oscillations of such devices have been as high as 20 gHz., and it has been shown that avalanche junctions can be made to oscillate at frequencies greater than 100 gHz. Assume the diode 99, is designed to oscillate at 10 gHz., the transmission line section formed by the metal vanes or thin film strips coupled to it such as vane 14 of FIG. 1*a* would be dimensioned to support this frequency and can be represented by the resonant circuit 93, which comprises an inductor 97 and capacitor 98 in shunt with diode 99. The 10 gHz. generated by the avalanche diode 99 is coupled to the varactor diode 91 via capacitor 106. Capacitance 106 is the capacitance fomed by the separation of the metal vanes 14 and 18 in FIG. 1*a*, designated as spacing 22. The vanes as 14 and 18 of FIG. 1*a* are spaced to provide a capacitance 106 whose reactance is low at 10 gHz. and upwards but is significant at 2 gHz. Hence, the 2 gHz. input signal coupled to the varactor diode 91 will not couple to the avalanche diode 99. The varactor 91 then is pumped by the 10 gHz. signal from the avalanche diode, and will perform as a parametric converter. The signals present across the varactor 91 have frequency components at 2G*c*, 10G*c*, 12G*c*, 8G*c* and harmonics of these. There is also shown another tuned circuit 116 across the varactor 91, comprising an inductor 117 and a capacitor 118 in shunt. This circuit represents the transmission line section formed by the metal vanes or thin film strips coupled to the varactor 13 one of which is designated as 14 in FIG. 1*a*. The vane 14 and its bottom vane, not shown in FIG. 1*a*, are dimensioned to support the 12 gHz. upper sideband component, and therefore 12 gHz. will be supported by these vanes and are so represented by the equivalent tuned circuit 116. The 12 gHz. signal will couple through capacitor 106 and a capacitor 107 corresponding to the spacing 21 between the vanes 18 and 20 in FIG. 1*a* to the tunnel diode 100. The diode 100 is biased in the reverse direction by a battery 110 which is isolated from the other D.C. sources by an inductor 105. In shunt across the tunnel diode 100 is a tuned circuit 120 comprising an inductor 121 and capacitor 122. This circuit is the equivalent of transmission line section formed by the thin film strips or metal vanes 20, 53 coupled to the tunnel diode 24 in FIG. 1*c*. The response of this circuit is broader than those previously described, and the vanes 20 and 53 are dimensioned and dielectrically loaded to support the 12 gHz. input generated across the diode 91 and the 10 gHz. coupled from the avalanche diode 99 through capacitor 107. The tunnel diode 100 is biased at a point on its I–V characteristics to provide optimum down converting action. The output tuned circuit 94, comprising an inductor 101 in shunt with a capacitor 102, which is the equivalent of the transmission line section formed by the output vanes 25 and 52 coupled to the tunnel diode 24 of FIG. 1*a*, is designed and dimensioned to support 2 gHz. Therefore, the output of the device will be at 2 gHz. amplified, by the action of the varactor 91 up conversion and tunnel diode 100's down conversion. It is noted that these devices are non-reciprocal and hence stable, as there is no feedback path from input to output. The signal arrows shown in FIG. 4 and marked with the respective frequencies show how the frequencies of interest circulate in the device. It also can be seen from FIG. 4 that the frequency of oscillation of the avalanche diode 99 is not critical as long as it is in the order of four or more times greater than the signal to be amplified, as the frequency of oscillation is added in the up conversion and subtracted in the down conversion. Hence the frequency can drift or change and still not affect the amplification of the input signal from supply 111.

Figure 5:
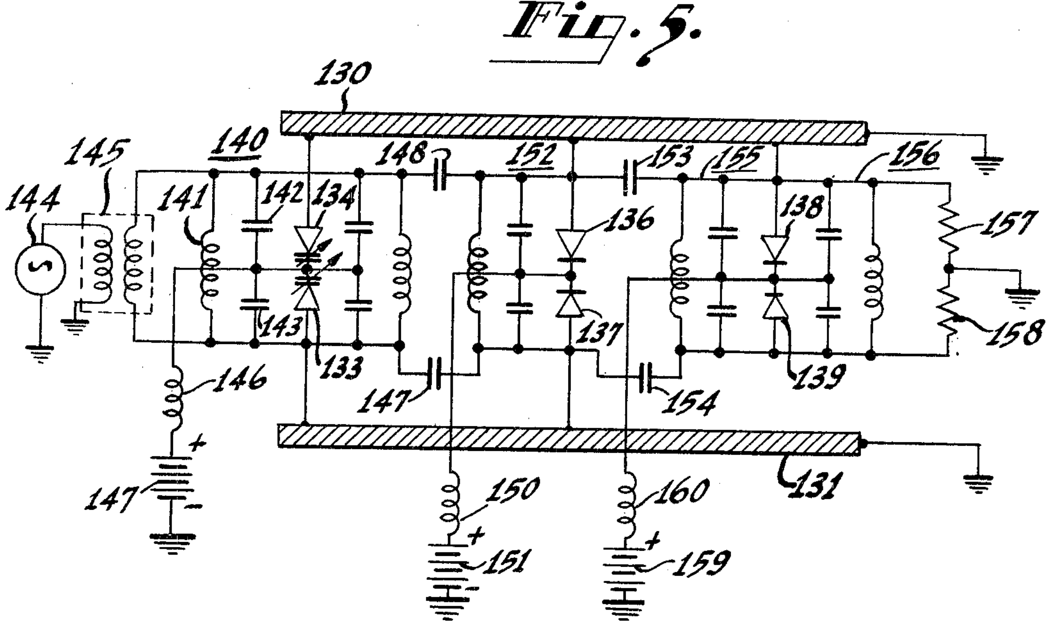
FIG. 5 is a schematic representation of the equivalent circuit of the device shown in FIG. 3.

FIG. 5 shows the equivalent circuit of the device depicted in FIG. 3. This is a balanced configuration as indicated previously. There are two ground plates 130 and 131, between which are shown two back-to-back varactors 133 and 134. There is a tuned circuit 140 in shunt with the varactors 133 and 134. The tuned circuit consists of an inductance 141 and two capacitors 142 and 143 which represent the capacitance formed by the center wafer of material 85 in FIG. 3*a* and the two outer ground plates 16 and 64 in FIG. 3*a*. This circuit is dimensioned to support the input band of frequencies emanating from a signal source 144, which is analogous to source 91 in FIG. 3*b*. The input signal from source 144 is fed in push-pull to the varactors 133 and 134 due to the action of the coupling transformer 145. The common junction of the varactors 133, 134 is coupled through an isolating inductor 146 to a D.C. source 147. This causes the varactors 133 and 134 to be reversed biased and hence exhibit a quiescent value of capacity. The varactors 133, 134 are pumped by the signal energy generated by the avalanche diodes 136 and 137 via the capacitors 148 and 149, which correspond to the capacity provided by the separation of the metal vanes or thin film strips discussed in conjunction with FIGS. 1, 2 and 3. The avalanche diodes 136 and 137 are biased in the avalanche oscillating region by a D.C. supply 151 which is coupled to the common junction of the diodes 136, 137 via an isolating inductor 150. The tuned circuit 156 represents the equivalent circuit of the transmission line section formed by the vanes or thin film strips previously described and is designed to support the avalanche oscillating frequency. The output oscillations from the avalanche diodes 136 and 137 are also coupled through capacitors 153 and 154 corresponding to the capacity provided by the proper separation of the thin film strips or metal vanes previously described to tunnel diodes 138 and 139 which serve as down-converters. There is shown a tuned circuit 155 across the tunnel diodes 138, 139 which circuit will support the upper sideband and avalanche oscillator frequency in a manner similar to that described in conjunction with FIG. 4. A tuned circuit 156 is shown in shunt across the tunnel diodes 138, 139 to support the amplified signal, or lower sideband conversion product. Also shown are two resistors 157 and 158 which represent the load to which the amplified signal is fed. The bias for the tunnel diodes 138 and 139 is supplied from a D.C. source 159 through an isolating inductor 160.

Figure 6:
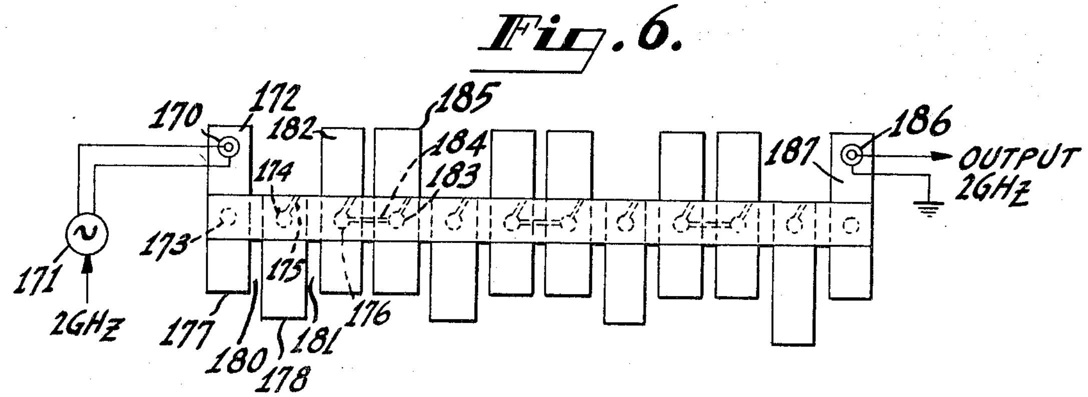
FIG. 6 is a top plane pictorial view of one embodiment of a distributed amplifier according to this invention.

In summation, the basic amplifier module as previously described consists of three diode units, an avalanche diode, a varactor diode and a tunnel diode. They are integrated on the same N-type semiconductor wafer and coupled through capacitance formed by proper separation of metal vanes or thin film strips, which serve as frequency supporting elements. The varactor diode amplifies the signal through a parametric up-conversion and the tunnel diode operates as a down converter, while the avalanche diode behaves as the source of pump signal for both devices. The basic amplifier module can have by way of example the following characteristics:

$fs$=2 gHz.=$2\times10^9$ c.p.s.=input signal frequency
$fp$=10 gHz.=$10\times10^9$ c.p.s.=pump frequency (freq. of oscillation of an avalanche diode)
$fa$=12 gHz.=$12\times10^9$ c.p.s.=up-conversion frequency
$Gu$=6 decibels=6 db=up-conversion gain
$Gd$=2 decibels=2 db=down-conversion gain
$Go$=8 decibels=8 db=overall gain
N.F.=3 decibels=3 db=noise figure
$Pp$=20 milliwatts=20 mw.=pump power
D=100 decibels=100 db=dynamic range
$\Delta f$=1 gHz.=$1\times10^9$ c.p.s.=band width
$Pi$=500 milliwatts=500 mw.=total D.C. input power FIG. 6 shows how the amplifier module described can be used to achieve high gain by cascading without deteriorating the stability. This is so because amplification takes place not only by a non-reciprocal transmission but also by frequency isolation. If reference is made to FIG. 6, there is shown a top view of four modules as described previously in cascade. Numeral 171 refers to a signal source which is coupled to an input metal vane 172, via the coaxial connector 170. The signal is coupled to a varactor diode 173 which is fabricated on a semiconductor wafer as previously described. The bis supply and the semiconductor wafer construction are omitted for the sake of clarity in FIG. 6 and the following figures. An avalanche diode 174 is caused to oscillate at 10 gHz. and pumps the varactor 173 by transferring energy via the spacing 180 which behaves as a capacitor between the thin film or metal vanes 177 and 178. There is shown a bias lead 175 by dotted line to indicate that such bias leads as 175 could be oriented in many suitable directions in lieu of those shown in FIGS. 1–3 and may terminate at the side of the device instead of the bottom. Any suitable orientation of the bias leads can be employed as understood in the art.

The 12 gHz. signal produced by the parametric up-conversion of the varactor 173 is directed to a tunnel diode 176 by the capacitive coupling provided by the spacings 180 and 181. The tunnel diode junction 176 produces the down-conversion back to 2 gHz. which frequency is supported by the transmission line section including the thin film strip 182. This 2 gHz. is coupled to the varactor 183 of the next stage via a coupling inductor 184 of suitable construction, shown as two dotted lines running from tunnel diode 176 to varactor 183. This inductor 183 together with the spacing between the transmission line sections including vanes 182 and 185 which support the 2 gHz. signal form a series resonant circuit whose frequency of resonance is set for 2 gHz. The up-conversion-down-conversion operation is repeated in the next stage, and so on, until the output is taken, amplified by the decibel gain of each stage, at coaxial connector 186 shown on the output, metal vane 187. Because the basic module is non-reciprocal such a module can be cascaded as shown but is not limited to the number of stages shown. Higher gain can be achieved by cascading a greater number of stages. The symmetry of the devices used allows the amplifier of FIG. 6 to be readily constructed by deposition processes on base materials used as supporting plates or mounts, such as epoxy, glass or aluminum oxide. The ground planes together with the coupling vanes can be deposited by the use of a suitable mask. A layer of dielectric is then deposited on the ground plane by using the same mask. Then the semiconductor wafer is treated and positioned to have the proper doped junctions along the length of the ground plane and in the center of the deposited coupling metal vanes. The spacing between the semiconductor and the vanes is filled in with a suitable dielectric and another coat of metal is then deposited using either the same mask as for the bottom section or one allowing for the coaxial connectors. Any suitable, conventional fabrication technique may be used.

Figure 7:
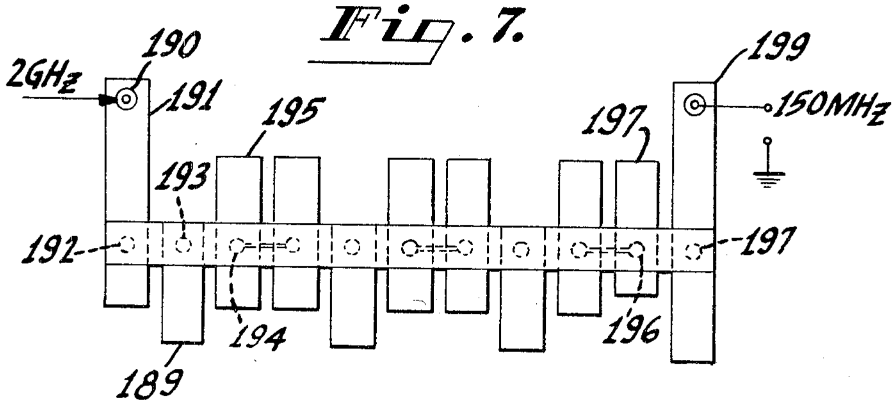
FIG. 7 is a top plane pictorial view of an amplifying mixer according to this invention.

FIG. 7 shows a top plane pictorial view of an amplifying mixer in accordance with this invention. The input frequency of 2 gHz., for example, fed to the input coaxial connection 190, and is supported by the transmission line section including the metal vane 191, where it is impressed upon the variable reactance diode 192. As before diode 193 is biased in the avalanche mode and oscillates at 10 gHz. providing the pump supply for the parametric up-conversion operation of diode 192 and for the down-conversion in the tunnel diode 194. The coupling scheme is as before, namely, through the capacitance formed by the proper spacing of the frequency supporting transmission line sections including in part the vanes 189, 191 and 195. Further amplification occurs through succeeding stages such that an amplified 2 gHz. signal is coupled to the transmission line section including the metal vane 197 and is fed to the varactor 196. The pump supply furnished by diode 197 could be a tunnel diode oscillator or an avalanche diode oscillator oscillating at 2 gHz. plus, for example, 150 MHz. or at a frequency of 2.150 gHz. The signal energy so produced pumps the varactor 196 as before. A transmission line section including the vane 199 is dimensioned to support the lower sideband or difference frequency, namely, 2.15 gHz. minus 2 gHz. or 150 MHz. The output then is a 150 MHz. signal which can be used as an I.F. frequency in a receiver or easily amplified by transistors or tubes to obtain greater power.

Figure 8:
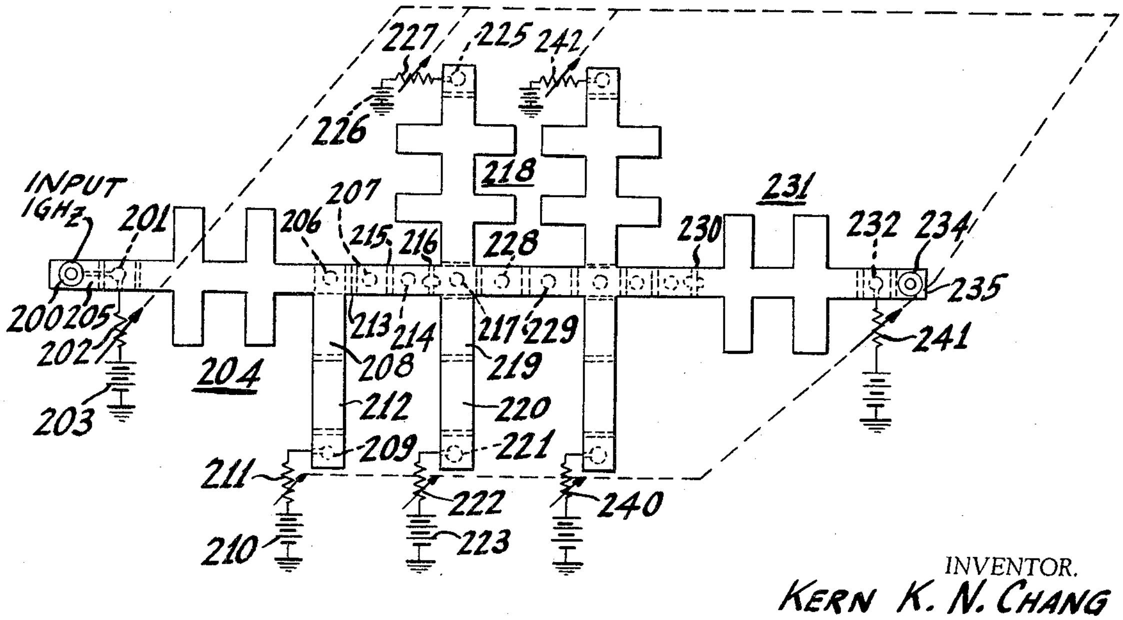
FIG. 8 is a top plane pictorial view of a tuned amplifier according to this invention.

FIG. 8 shows a top plane pictorial view of a tuned amplifier with tracking capabilities. The input coaxial connector 200 is mounted on a top plate 205, which serves as an inductor. The input source is shown as an arrow labelled 1 gHz., and represents an antenna, a preamplifier or another suitable source of signals. The input frequency is directed to the varactor diode 201, whose junction is reversed biased by battery 203 through variable resistor 202. By varying the setting of variable resistor 202, the effective capacity of the varactor 201 can be continuously varied over a six to one range and a plurality of resonant points can be obtained determined by the varactor diode 201's capacity taken with the effective inductance of the plate or vane 205. This tuning aids in peaking the input signal and allows broad band operation. Numeral 204 refers to a low pass filter. Such a filter which has the configuration as shown is made by fabricating a bottom plate identical to the top plate, depositing a layer of dielectric thereon, and then fabracting a top plate as shown on the dielectric layer. The combination of top, bottom and dielectric layer form a strip transmission line filter. The strip transmission line structure 204 behaves as a low pass filter and allows the 1 gHz. peaked signal to pass through to varactor diode 206, which serves as an up converter. For the sake of clarity the bias supplies for certain of the devices as varactor 206 have been omitted. The pump supply for the varactor 206 is furnished by the avalanche diode 207, which is reversed biased into the avalanche mode by a D.C. source not shown. The avalanche diode 207 is caused to oscillate at 10 gHz. and the upper sideband signal or idler of 11 gHz. is supported by the transmission line section including the vane 208. The 11 gHz. signal is coupled through a half-wave length strip transmission line 212 to another varactor diode 209 which is biased through a variable resistor or potentiometer 211 from a D.C. source 210. The varactor 209 in conjunction with the half-wave strip transmission line 212 serves to tune the idler supporting transmission line section 208 to accommodate broad band operation. For instance if the input signal changes in frequency by plus .5 gHz., the idler will change to 11.5 gHz. The transmission line section 208 will now be tuned via the half-wave line section 212 and varactor 209 to the new idling frequency of 11.5 gHz. The energy from the pump avalanche diode 207 is coupled to varactor 206 via the spacing 213 therebetween. The spacing 213 as before behaves as a capacitor at the pump frequency of 10 gHz. The pump frequency from the avalanche diode 207 is also supplied to the tunnel diode 214 via spacing 215. The tunnel diode behaves as a down converter, receiving the 10 gHz. pump and the 11 gHz. idler and producing a 1 gHz. output. The 11 gHz. signal is coupled to the tunnel diode 214 via spacings 213 and 215 which behave as capacitors and will pass the 11 gHz. idler. There is shown a cutout 216 in the strip transmission line assembly which behaves as a low pass filter, and the amplified 1 gHz. signal is coupled to varactor 217 which is in turn coupled to a low pass filter 218 to support the 1 gHz. signal.

Also coupled to the varactor 217 is an idling transmission line section including a vane 219, which supports the idling frequency generated by the parametric up-conversion as discussed previously in conjunction with up converter varactor 206. A tuning varactor 221 biased through variable resistor 222 from a D.C. supply 223 is coupled through a half-wave length strip transmission line 220, all of which serve the same function as their counterparts described in connection with varactor 206.

There is also shown a tuning varactor 225 which is biased from a D.C. supply 226 through a variable resistor 227 to allow tuning and matching of the low pass filter 218 for broad band operation. The pump for the up-converter varactor 217 is supplied by an avalanche diode 228 as before. Diode 228 also supplies pump energy for the tunnel diode down-converter 229. There is shown another stage identical to the one previously described for additional gain. The output of which is coupled through a low pass filter 230 and further filtered by the action of a low pass filter 231, whose output is coupled to a varactor 232 which in conjunction with a transmission line section including a metal vane assembly 234 behaves as a further peaking circuit to enable a clean amplified 1 gHz. signal to appear at the output coaxial connection 235. The dashed line connecting the variable arm of the variable resistors 202, 227, 211, 222, 240, 242, 241 is drawn to indicate mechanical cooperation so that a single tuning control can be used to vary the band of frequencies to be amplified. The controls as illustrated can accommodate an input frequency band over a three to one frequency range (i.e. 1 gHz.–3 gHz.).

Figure 9:
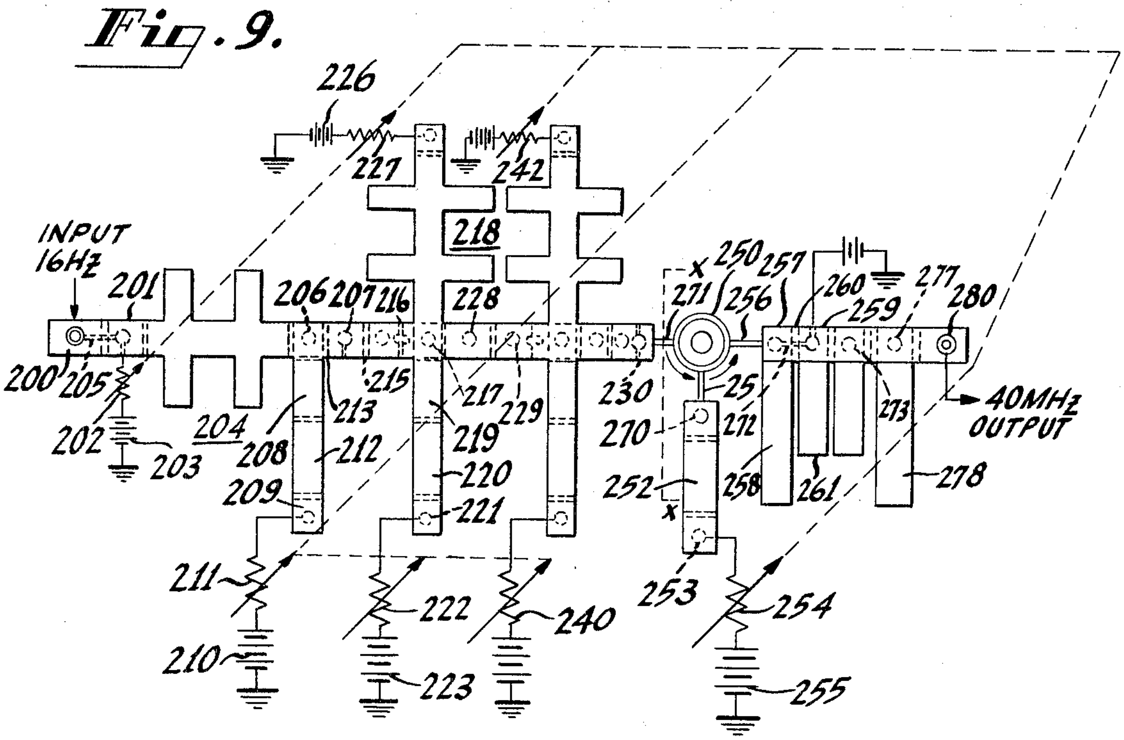
FIG. 9 is a top plane pictorial view of one embodiment of an intermediate frequency tuned amplifier according to this invention.

FIG. 9 shows a top plane pictorial view of another tunable amplifier according to this invention. Everything to the left of line *x—x* has been described in connection with FIG. 8. In the case of the embodiment shown in FIG. 9, it is desired to obtain an output frequency which contains all the information in the 1 gHz. input signal but the output frequency is to be substantially lower. Hence this would be a case where a circulator would be desirable. The low pass filter 230 is coupled to one port of a ferrite circulator 250. A circulator such as 250 is a non-reciprocal device which will transmit energy incident on one port in a given direction only to the next successive port, in the direction of the arrows shown in the drawing. Hence the energy at a frequency of 1 gHz. incident on port 271 is transmitted to port 251. The port 251 is terminated by a strip transmission line 252 of one-half wave length which is, in turn, coupled to a tuning varactor 253. The varactor 253 is biased through a variable resistor 254 from a battery 255. The function of the varactor 253 and the associated variable resistor 254 is to accommodate a broad band of input frequencies while terminating the circulator 250 at port 251 in a suitable impedance to prevent reflections back to the 1 gHz. input port 271. There is also shown coupled to port 251 another diode, or oscillating device 270 which may be an avalanche diode or a tunnel diode oscillating at 1.04 gHz., for example. The energy from the oscillator 270 is coupled to port 256 as is the energy incident on port 271. The received signal energy is fed to a mixer diode 257 which is a conventional P-N junction. An output transmission line section including a vane 258 is dimensioned to support the difference frequency which is 1.04 gHz. minus 1.0 gHz. or 40 MHz. The 40 MHz. signal is coupled to a varactor up-converter diode 259 via the spacing 260 between transmission line sections including vanes 258 and 261 and an inductor 272. The varactor up-converter 259 is pumped by an avalanche diode 273 which oscillates at 10 gHz., for example. The upper sideband signal of 10.04 gHz. is transmitted to a tunnel diode down-converter 277 whose output transmission line section including a vane 278 is dimensioned to support the 40 MHz. lower sideband signal created by pumping the tunnel diode 277 with 10 gHz. from avalanche diode 273 together with the 10.04 gHz. signal from the up-converter 259 as described previously. The output at 40 MHz. is taken from coaxial connector 280 for further processing. It can be seen that this technique lends itself to versatility, permitting the devices described to be incorporated with circulators, if desired, to obtain improved low frequency operation.

Figures 10, 12:
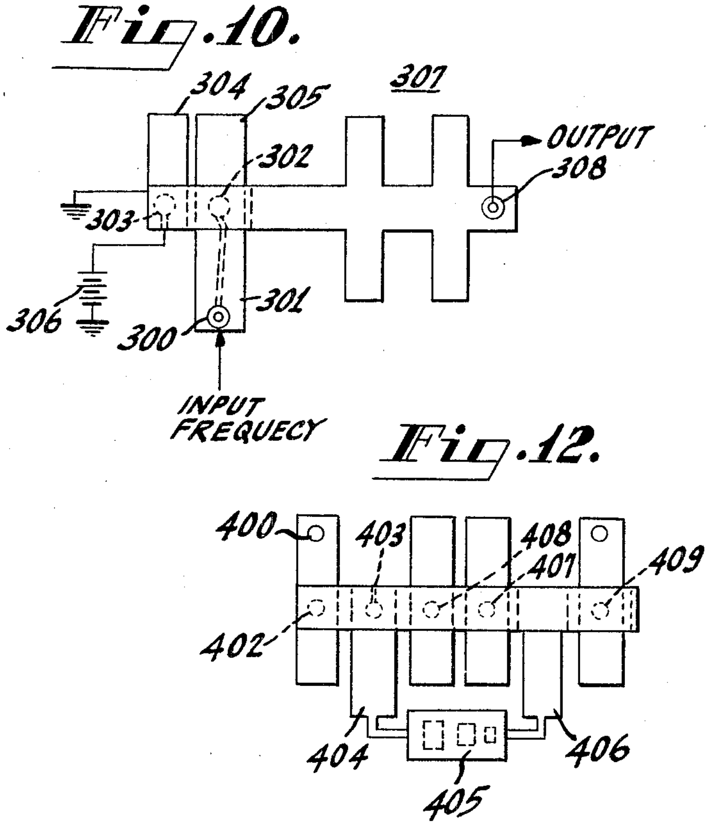
FIG. 10 is a top plane pictorial view of a further embodiment of an amplifier or upconverter according to the invention.
FIG. 12 is a top plane pictorial view of an amplifier circuit using a single oscillator for a pump supply in accordance with this invention.

FIG. 10 is a top plane pictorial view of an amplifying down-converter according to this invention. The input coaxial connector 300 is counted on a transmission line section including a vane 301 so that a received signal is coupled thereby to a varactor parametric converter 302. Numeral 303 references an avalanche diode biased in the avalanche region to exhibit microwave oscillations. If the semiconductor wafer as described in conjunction with FIGS. 1–3 were gallium arsenide (GaAs) then diode 303 could be bulk material and caused to oscillate by the well know Gunn effect, as described in I.B.M. Research Reports—vol. 1, No. 1, November 1965. The diode 303 is caused to oscillate at a microwave frequency and such oscillations are supported by the transmission line section including vane 304. The energy from the microwave oscillator 303 is coupled to the varactor converter 302 via the spacing and the resultant capacity between the transmission line sections including the vanes 304 and 305. The output of the varactor 305 is taken at the lower sideband which is the difference between the input frequency and the microwave oscillator 303's frequency. The output frequency is filtered by the transmission line low pass filter 307. An output coaxial connector 308 allows connection of the amplifying down-converter to external circuitry. The bias supply for the microwave oscillator 303 and the varactor converter 302 are supplied from the same bias supply 306.

Figure 11:
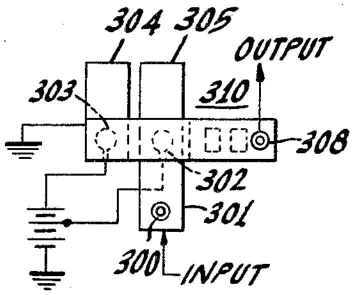
FIG. 11 is a top plane pictorial view of an embodiment of another amplifying mixer or converter according to this invention.

FIG. 11 shows the same converter as FIG. 10 except that it is terminated with a high pass or band pass filter 310 allowing the upper sideband to couple through to the output coaxial connector 308. Band pass or high pass filters as 310 are fabricated by strip transmission line techniques by forming different shaped rectangular cutouts in the dielectric between the two ground plates or layers. The cutouts can be dimensioned to obtain any desired response. See for example the article "Exact Design of Capacitive-gap Strip-line Filters," by John R. Pyle, Harry E. Brein, Microwaves, May 1966, vol. 5, No. 5.

FIG. 12 shows a two-stage amplifier, similar to that described with reference to FIG. 6. In this embodiment, the pump avalanche diode 403 supplies pump signal energy to the varactor diode up-converters 402 and 407 and to the tunnel diode down-converters 408 and 409. Reference numeral 404 refers to the transmission line section coupled to the avalanche diode 403. A band pass filter 405 is coupled to the section 404 and causes signal energy from the diode 403 to couple to transmission line section 406 which in turn couples the pump energy to varactor 407 and to tunnel diode 409 via the capacitance between section 406 and the transmission line sections respectively coupled to the two diodes 407 and 409. The single pump supply 403 could be an avalanche diode or an integrated transistor oscillator to obtain high power followed by a few stages of integrated varactor multiplier circuits to obtain the high frequency operation.

While the invention has been described in connection with amplifiers, it is not so limited. The invention can be used to provide high frequency multipliers, dividers, mixers, modulators, and so on. Further, the pump supplies could also be integrated transistor oscillator circuits followed by a series of varactor multipliers, which may be used in lieu of the avalanche diodes, or tunnel diode oscillators as described.

I claim:

1. In combination, (a) a wafer of semiconductor material having a specified conductivity and having a plurality of regions thereon each having a different impurity density, (b) a plurality of zones of said semiconductor material having opposite conductivity and of the same impurity density as said respective regions each individually positioned on said wafer in cooperative relationship with that individual one of said regions corresponding in impurity density thereto to form a plurality of different diode devices, and (c) a plurality of frequency selective transmission line sections each dimensioned to be resonant at a desired frequency positioned with respect to said wafer to cause each of said sections to be capacitively coupled to at least one of said diode devices with said diode devices coupled to one another through said sections.

2. In combination, (a) a wafer of semiconductor material having N-type conductivity and having a plurality of regions each having different impurity densities, (b) a plurality of zones of p-type semiconductor material deposited on said wafer with each respective one of said zones being individually associated with solely one of said regions on said wafer causing a plurality of different characteristic P-N devices to be formed on said wafer, and (c) a plurality of frequency selective transmission line sections each dimensioned to be resonant at a desired frequency positioned with respect to said wafer so that at least a different one of said plurality of sections is coupled to each of said different P-N devices.

3. In combination, (a) a wafer of semiconductor material having one type of conductivity and having a plurality of regions having different impurity densities, (b) a plurality of zones of said semiconductor material of opposite conductivity positioned on said wafer, each of said zones being individually associated with solely one of said regions on said wafer to form a plurality of different characteristic P-N devices on said wafer, (c) a plurality of separated frequency selective transmission line sections each dimensioned to be resonant at a desired frequency positioned with respect to said wafer so that every one of said plurality of sections is capacitively coupled to at least one of said different P-N devices with said devices coupled to one another through said sections, (d) biasing means connected to provide a separate bias to each of said P-N devices determined by the impurity density of the P-N device to cause one of said P-N devices to be biased in an oscillating mode, a second one of said devices to be biased in a down conversion mode, and a third one of said devices to be biased in an up conversion mode, (e) means for applying an input signal at a given frequency to said third P-N device through one of said sections coupled to said third P-N device, said sections operating to couple oscillations of said first P-N device to said third P-N device producing at said third P-N device a signal at a frequency equal to the sum of said given frequency plus the frequency of said oscillations and further operating to couple said oscillations of said first P-N device and said sum frequency produced by said third P-N device to said second device so that a further signal having a frequency equal to the difference between the frequency of said oscillations and said sum frequency is produced by said second device, (g) means for deriving an output signal corresponding to said further signal from one of said sections coupled to said second P-N device.

4. The combination as claimed in claim 3, said sections being physically spaced one from another predetermined distances to provide a low capacitive reactance coupling between said devices at the frequency of said oscillations and at said sum frequency.

5. In combination, a wafer of semiconductor material having at least a first and second active device formed thereon, a first strip frequency selective transmission line section coupled to said first device and dimensioned to be resonant at the frequency of given signal energy appearing at said first device, and a second strip frequency selective transmission line section coupled to said second device dimensioned to be resonant at the frequency of given signal energy appearing at said second device and physically spaced from said first section to provide a predetermined capacitive reactance coupling between said lines for said signal energy.

6. In combination, a wafer of semiconductor material having a plurality of active devices formed thereon, and a separate frequency selective transmission line section for each of said devices with said lines being physically spaced one from another to provide a capacitive coupling for signal energy between said devices.

7. In combination, (a) a wafer of semiconductor material having three different characteristic semiconductor devices formed thereon, (b) means for applying a separate bias to each of said three different characteristic semiconductor devices causing a first one of said devices to oscillate at a first frequency, (c) a frequency selective transmission line assembly coupled to said first device dimensioned to be resonant at said first frequency, (d) a second frequency selective transmission line assembly coupled to a second of said devices dimensioned to be resonant at a second frequency physically spaced from said first assembly to thereby provide a capacitive reactance between said first assembly and said second assembly for coupling signal energy at said first frequency to said second of said devices, (e) means to apply an input signal at said second frequency to said second device to cause said input signal and said signal energy at said first frequency to interact across said second device to produce a signal at a third frequency, said first and second assemblies being dimensioned to be resonant at said third frequency and spaced to couple signal energy at said third frequency through said capacitive reactance, (f) a third frequency selective transmission line assembly coupled to the third of said devices dimensioned to be resonant at said third frequency and being physically spaced from said first assembly to thereby provide a second capacitive reactance between said first assembly and said third assembly for coupling signal energy at said first frequency and at said third frequency so that the signal energy at said first frequency and at said third frequency interacts across said third device to produce signal energy at said second frequency, and (g) means coupled to said third device to derive an output signal at said second frequency.

8. The combination as claimed in claim 7, said wafer of semiconductor material is N-treated gallium arsenide, said second device is formed as a gallium arsenide varactor, and said third device is formed as a gallium arsenide tunnel diode.

9. In combination, (a) a semiconductor wafer having a tunnel diode junction, a varactor diode junction, and an avalanche diode junction formed thereon, (b) means including a plurality of strip transmission lines physically spaced from one another and arranged with respect to said wafer to couple said avalanche diode junction, said tunnel junction, and said varactor junction to one another through a capacitive reactance, (c) means for applying a reverse bias to said tunnel, varactor and avalanche diode junctions in a manner to cause said varactor junction to be biased for parametric upconversion, said tunnel junction for down conversion and said avalanche diode for microwave oscillations at a first frequency, (d) means for coupling an input signal at a second frequency to said varactor diode junction causing said varactor to produce an idling frequency by said parametric upconversion equal to the sum of said first and second frequencies whereupon a signal is produced by said tunnel diode junction whose frequency corresponding to the difference of said idling frequency and said first frequency is equal to said second frequency but whose energy compared to that of said input signal is substantially increased.

10. In combination, (a) a wafer of semiconductor material, (b) a varactor diode junction located in a first region near one end of said wafer, (c) an avalanche diode junction located at a second region near the center of said wafer, (d) a tunnel junction located in a third region near the opposite end of said semiconductor wafer, (e) a first strip transmission line coupled to said wafer at said first region and dimensioned to be resonant for energy at a first frequency.

(f) a second strip transmission line dimensioned to be resonant for energy at a second frequency and coupled to said wafer at said center region, said second line being physically spaced from said first line to provide a predetermined capacitive reactance coupling therebetween at said first and second frequencies, (g) a third strip transmission line dimensioned to be resonant for energy at said first and second frequencies coupled to said wafer at said third region, said third line being physically spaced from said first and second lines to provide a predetermined capacitive reactance coupling therebetween at said first and second frequencies, (h) means for reverse biasing said varactor, tunnel and avalanche junctions in a manner to cause said avalanche diode junction to oscillate at said second frequency, (i) means for applying an input signal at a third frequency to said first region of said semiconductor wafer causing said varactor junction as biased from said biasing means to parametrically produce an idling signal at said first frequency equal to the sum of said second and third frequencies, (j) said capacitive reactance coupling provided by the spacing of said lines causing said idling signal and signal energy at said second frequency to propagate to said tunnel junction, (k) said tunnel diode junction being biased from said biasing means to produce in response to said idling signal and said signal energy at said second frequency signal energy at said third frequency, and (l) means to derive signal energy at said third frequency from said tunnel diode junction.

References Cited

UNITED STATES PATENTS 3,391,346 7/1968 Uhlir ............ 307—303 X

ROY LAKE, Primary Examiner

L. J. DAHL, Assistant Examiner

U.S. Cl. X.R.

307—303